United States Patent
Kurahashi et al.

(10) Patent No.: US 10,644,665 B2
(45) Date of Patent: May 5, 2020

(54) AMPLIFIER WITH AMPLIFICATION STAGES CONNECTED IN PARALLEL

(71) Applicant: FUJITSU LIMITED, Kawasaki-shi, Kanagawa (JP)

(72) Inventors: Naoko Kurahashi, Isehara (JP); Masaru Sato, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 16 days.

(21) Appl. No.: 16/177,552

(22) Filed: Nov. 1, 2018

(65) Prior Publication Data
US 2019/0207574 A1    Jul. 4, 2019

(30) Foreign Application Priority Data

Dec. 28, 2017 (JP) ................. 2017-254608

(51) Int. Cl.
*H03F 3/68* (2006.01)
*H03F 3/60* (2006.01)
(Continued)

(52) U.S. Cl.
CPC ............. *H03F 3/601* (2013.01); *H03F 3/193* (2013.01); *H03F 3/245* (2013.01); *H03F 3/211* (2013.01);
(Continued)

(58) Field of Classification Search
CPC .......... H03F 3/601; H03F 3/245; H03F 3/193; H03F 2200/423; H03F 2200/255; H03F 2200/543; H03F 3/211; H03F 3/602; H03F 3/604; H03F 3/607; H03F 1/0288; H03F 3/191; H03F 1/56; H03F 1/565
(Continued)

(56) References Cited

U.S. PATENT DOCUMENTS 5,111,157 A * 5/1992 Komiak ................. H03F 3/604
                                                              330/286
5,162,756 A * 11/1992 Taniguchi ................. H01P 5/12
                                                              330/295
(Continued)

FOREIGN PATENT DOCUMENTS

WO    2012-160755 A1    11/2012
WO    2015-29486 A1      3/2015

*Primary Examiner* — Khanh V Nguyen
(74) *Attorney, Agent, or Firm* — Westerman, Hattori, Daniels & Adrian, LLP

(57) ABSTRACT

An amplifier includes amplification stages connected in parallel between an input point and an output point and a feedback circuit, wherein the amplification stages each include a transistor configured to amplify a signal supplied from the input point, a harmonic processing unit configured to process harmonics present in an amplified signal output from an output node of the transistor, a connection point between the output node and the harmonic processing unit, and a transmission line connecting the connection point and the output point, wherein the feedback circuit feeds back a signal at the output point or a midway point of the transmission line of a given one of the amplification stages to a first end of a resistor connected to the connection point of the given one of the amplification stages, a second end of the resistor being connected to the connection point of another one of the amplification stages.

7 Claims, 7 Drawing Sheets

(51) Int. Cl.
*H03F 3/193* (2006.01)
*H03F 3/24* (2006.01)
*H03F 3/21* (2006.01)

(52) U.S. Cl.
CPC ............... *H03F 3/602* (2013.01); *H03F 3/68* (2013.01); *H03F 2200/255* (2013.01); *H03F 2200/423* (2013.01); *H03F 2200/543* (2013.01)

(58) Field of Classification Search
USPC .......................... 330/124 R, 286, 295, 302
See application file for complete search history.

(56) References Cited

U.S. PATENT DOCUMENTS

| | | | | |
|---|---|---|---|---|
| 5,939,939 | A * | 8/1999 | Gaynor | H03F 3/602 330/124 R |
| 6,201,445 | B1 * | 3/2001 | Morimoto | H03F 3/604 330/286 |
| 6,411,655 | B1 * | 6/2002 | Holden | H04L 27/361 332/103 |
| 7,411,449 | B2 * | 8/2008 | Klingberg | H03F 3/602 330/124 R |
| 7,474,156 | B2 * | 1/2009 | Fujii | H03F 3/602 330/124 R |
| 10,396,722 | B2 * | 8/2019 | Hase | H03F 3/211 |
| 2013/0106519 | A1 | 5/2013 | Kamiyama et al. | |
| 2016/0211815 | A1 | 7/2016 | Imai et al. | |

* cited by examiner

AMPLIFIER WITH AMPLIFICATION STAGES CONNECTED IN PARALLEL

CROSS-REFERENCE TO RELATED APPLICATIONS

The present application is based upon and claims the benefit of priority from the prior Japanese Patent Application No. 2017-254608 filed on Dec. 28, 2017, with the Japanese Patent Office, the entire contents of which are incorporated herein by reference.

FIELD

The disclosures herein relate to an amplifier.

BACKGROUND

There are certain types of amplifiers known in the art that include harmonic processing circuits provided for respective transistors to process harmonics present in the signals output from the transistors and a matching circuit situated at the stage following the harmonic processing circuits to combine the output signals of the transistors. In such an amplifier, the output terminals of transistors may be connected to each other through resistors in order to reduce oscillation that may occur due to phase differences between the output signals of transistors (see Patent Document 1, for example).

The point at which a harmonic processing circuit is coupled to a respective transistor may correspond to the antinode of a standing wave. In such a case, phase differences between standing waves occurring at the respective points may cause large electric power exceeding a tolerance level to be applied to the oscillation-suppression resistors connecting these points, thereby creating a risk of an open-circuit failure at the resistors.

RELATED-ART DOCUMENTS

Patent Document

[Patent Document 1] International Publication Pamphlet No. WO2012/160755

SUMMARY

According to an aspect of the embodiment, an amplifier includes a plurality of amplification stages connected in parallel between an input point and an output point and a feedback circuit, wherein each of the plurality of amplification stages includes a transistor configured to amplify a high-frequency signal supplied from the input point, a harmonic processing unit coupled to an output node of the transistor and configured to process harmonics present in an amplified high-frequency signal output from the output node, a connection point between the output node and the harmonic processing unit, and a transmission line connecting the connection point and the output point, wherein the feedback circuit is configured to feed back a signal at the output point or a midway point of the transmission line of a given one of the amplification stages to a first end of a resistor, the first end of the resistor being connected to the connection point of the given one of the amplification stages, and a second end of the resistor being connected to the connection point of another one of the amplification stages.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments of the present disclosures will be described with reference to accompanying drawings.

Figure 1:
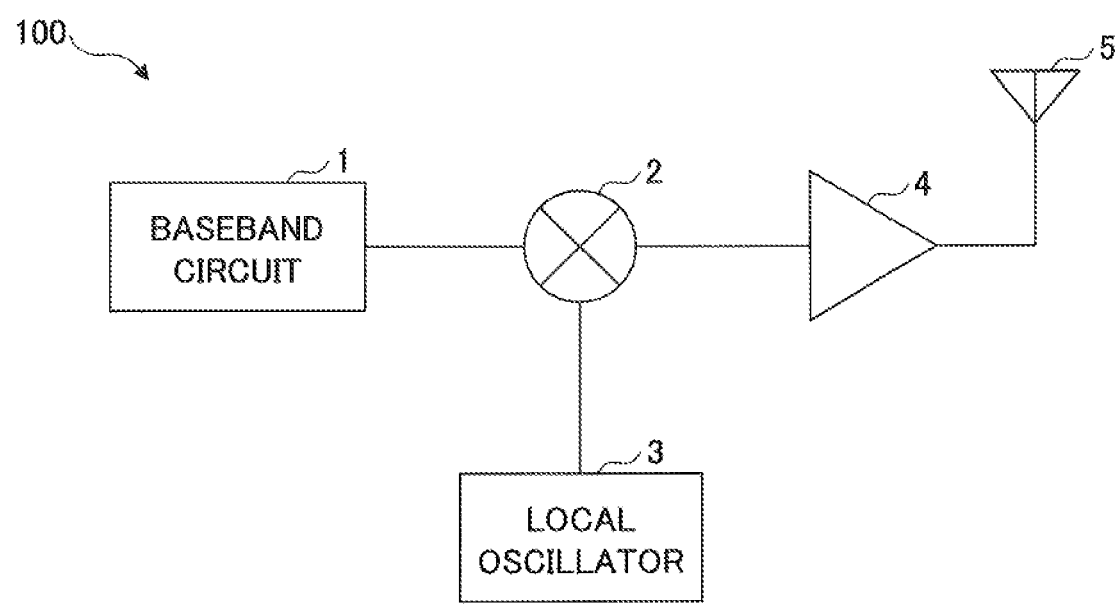
FIG. 1 is a drawing illustrating an example of the configuration of a transmitter.

FIG. 1 is a drawing illustrating an example of the configuration of a transmitter having an amplifier of the present disclosures. A transmitter 100 may be used as a wireless communication device for transmitting and receiving radio waves, a sensor device such as a radar, and a microwave heating device for transmitting microwaves to heat an object, for example.

The transmitter 100 may include a baseband circuit 1, a mixer 2, a local oscillator 3, a power amplifier 4, and an antenna 5. A baseband signal or intermediate frequency signal modulated by and output from the baseband circuit 1 is converted into a transmission frequency band by the mixer 2 and the local oscillator 3 for amplification by the power amplifier 4. The signal having been amplified by the power amplifier 4 is transmitted from the antenna 5 which is coupled to the output node of the power amplifier 4. The mixer 2 mixes the baseband signal or intermediate frequency signal from the baseband circuit 1 with the local oscillator signal from the local oscillator 3 to supply the mixed signal to the input node of the power amplifier 4. The amplifier of the present disclosures may be used as the power amplifier 4.

In the following, an amplifier that is an example to be compared with the amplifier of the present disclosures will be described first.

Figure 2:
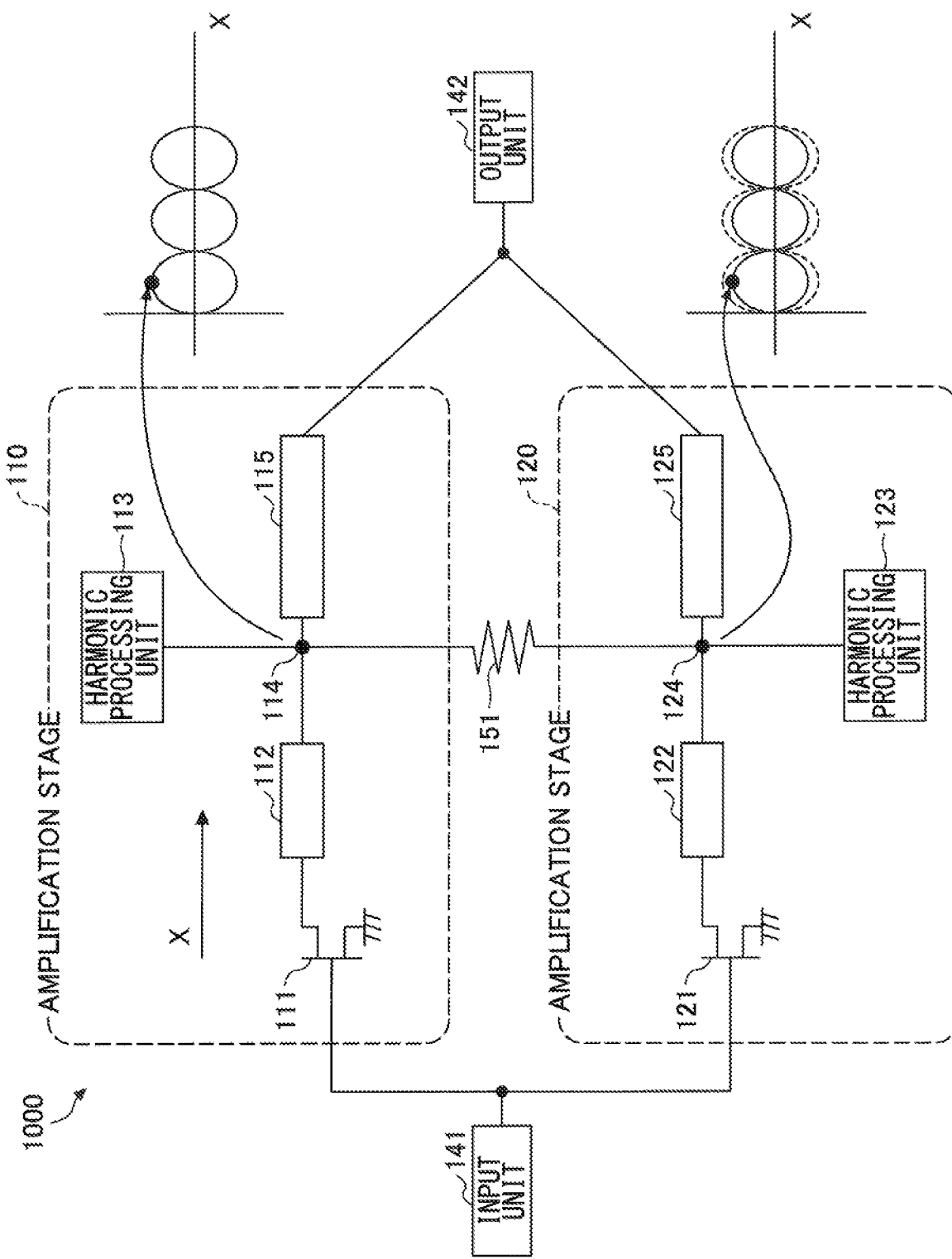
FIG. 2 is a drawing illustrating an amplifier serving as a comparative example.

FIG. 2 is a drawing illustrating an amplifier serving as a comparative example. An amplifier 1000 includes two amplification stages 110 and 120 that are connected in parallel between an input unit 141 and an output unit 142.

The amplification stage 110 includes a transistor 111, a transmission line 112, a harmonic processing unit 113, and a transmission line 115. The transistor 111 amplifies a high-frequency signal supplied from the input unit 141. The harmonic processing unit 113 processes harmonics present in the amplified high-frequency signal output from the transistor 111. The output node of the transistor 111 is coupled to the harmonic processing unit 113 via the transmission line 112. A connection point 114 which is connected to the harmonic processing unit 113 is coupled to the output unit 142 via the transmission line 115.

Similarly, the amplification stage 120 includes a transistor 121, a transmission line 122, a harmonic processing unit 123, and a transmission line 125. The transistor 121 amplifies a high-frequency signal supplied from the input unit 141. The harmonic processing unit 123 processes harmonics present in the amplified high-frequency signal output from the transistor 121. The output node of the transistor 121 is coupled to the harmonic processing unit 123 via the transmission line 122. A connection point 124 which is connected to the harmonic processing unit 123 is coupled to the output unit 142 via the transmission line 125.

Namely, the amplifier 1000 uses each of the transistors 111 and 121 to amplify the high-frequency signal supplied from the input unit 141, and combines the amplified signals output from the transistors 111 and 121 via the transmission lines 115 and 125 for provision to the output unit 142. In order to reduce oscillation caused by a phase difference between the signals output from the transistors 111 and 121, the amplifier 1000 includes a resistor 151 connecting the connection point 114 and the connection point 124.

Each of the harmonic processing units 113 and 123 is an open stub having a length equal to a quarter wavelength of the second harmonic present in the amplified high-frequency signal that is output from a respective one of the transistors 111 and 121, for example. Since an open stub having a length equal to a quarter wavelength of the second harmonic is connected to the connection points 114 and 124, each of the connection points 114 and 124 corresponds in position to the antinode of a second harmonic standing wave as illustrated in FIG. 2. Accordingly, a standing wave is created along the resistor 151 linking the connection point 114 and the connection point 124.

When there is variation in circuit characteristics between the amplification stage 110 and the amplification stage 120, a phase difference may develop between the standing waves occurring at the respective connection points 114 and 124. With a phase difference between the standing waves occurring at the respective connection points 114 and 124, the potential of the connection point 124 may become lower than the potential of the connection point 114 at a certain point in time. The presence of a potential difference between the connection point 114 and the connection point 124 may cause electric power exceeding a tolerable level to be applied to the resistor 151, thereby giving rise to a risk of an open-circuit failure at the resistor 151.

The amplifier of the present disclosures is configured to reduce the occurrence of an open-circuit failure at the one or more resistors connecting connection points. In the following, the amplifier of the present disclosures will be described.

Figure 3:
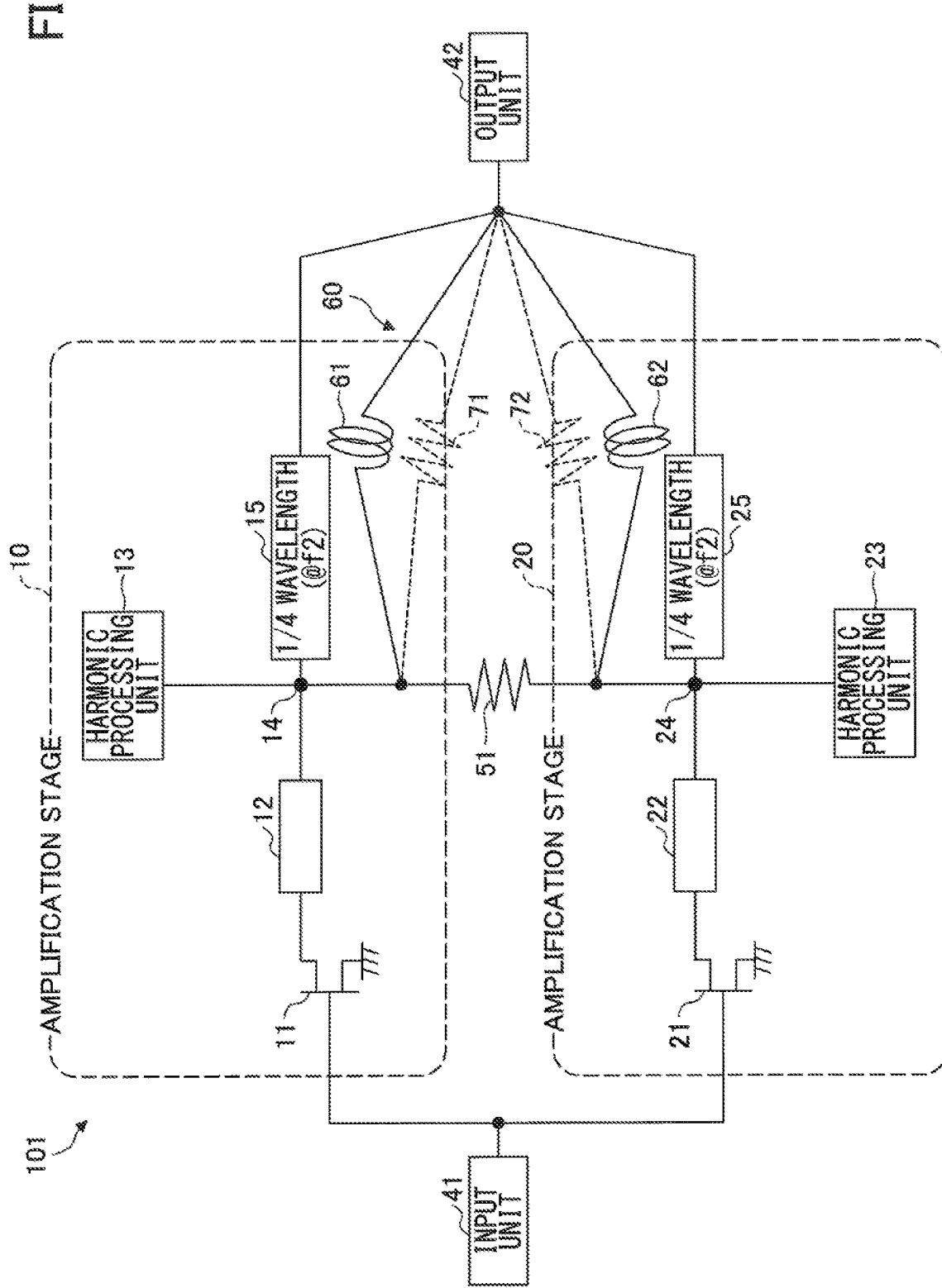
FIG. 3 is a drawing illustrating an amplifier according to a first embodiment.

FIG. 3 is a drawing illustrating an amplifier according to a first embodiment. An amplifier 101 includes two amplification stages 10 and 20 that are connected in parallel between an input unit 41 and an output unit 42, and further includes a feedback circuit 60.

A high-frequency signal (e.g., microwave signal) supplied from the input unit 41 is distributed to the amplification stages 10 and 20. Each of the amplification stages 10 and 20 amplifies the supplied high-frequency signal. The high-frequency signals amplified by the respective amplification stages 10 and 20 are combined and output from the output unit 42. The output unit 42 represents a superimposition point at which the high-frequency signals amplified by the respective amplification stages 10 and 20 are combined.

The amplification stages 10 and 20 have the same or similar circuit configuration. The amplification stage 10 includes a transistor 11, a transmission line 12, a harmonic processing unit 13, a connection point 14, and a transmission line 15, for example. The amplification stage 20 includes a transistor 21, a transmission line 22, a harmonic processing unit 23, a connection point 24, and a transmission line 25, for example.

Each of the transistors 11 and 21 amplifies a high-frequency signal supplied from the input unit 41. Each of the transistors 11 and 21 may be an FET (field effect transistor) having a gate, a source, and a drain. In such a case, the high-frequency signal supplied from the input unit 41 is applied to the gate of each of the transistors 11 and 21, and the amplified high-frequency signals are output from the drains serving as output nodes. Each of the transistors 11 and 21 may alternatively be a unit transistor comprised of a plurality of transistor cells whose gates are coupled to each other.

The harmonic processing unit 13, which is coupled to the output node of the transistor 11, processes harmonics present in the amplified high-frequency signal output from the output node of the transistor 11. The output node of the transistor 11 is coupled to one end of the harmonic processing unit 13 at the connection point 14 via the transmission line 12. Similarly, the harmonic processing unit 23, which is coupled to the output node of the transistor 21, processes harmonics present in the amplified high-frequency signal output from the output node of the transistor 21. The output node of the transistor 21 is coupled to one end of the harmonic processing unit 23 at the connection point 24 via the transmission line 22.

It is preferable for the harmonic processing unit 13 to provide a short-circuit state (i.e., substantially zero impedance) with respect to the second harmonic present in the amplified high-frequency signal output from the output node of the transistor 11. For example, the harmonic processing unit 13 provides a short-circuit state with respect to the second or higher even-numbered harmonics and an open-circuit state with respect to the third or higher odd-numbered harmonics. The same applies in the case of the harmonic processing unit 23.

The harmonic processing unit 13 is an open stub having a length equal to a quarter wavelength of the second harmonic f2 present in the amplified high-frequency signal that is output from the output node of the transistor 11, for example. In order for the harmonic processing unit 13 to provide a short-circuit state with respect to the second harmonic f2, the length of the open stub is set to $\lambda/8$ for the wavelength $\lambda$ of the fundamental wave, and is set to $\lambda_2/4$ for the wavelength $\lambda_2$ of the second harmonic f2 whose frequency is two times the frequency of the fundamental wave. The same applies in the case of the harmonic processing unit 23.

The connection point 14 which is connected to the harmonic processing unit 13 is coupled and matched to the output unit 42 via the transmission line 15. The connection point 24 which is connected to the harmonic processing unit 23 is coupled and matched to the output unit 42 via the transmission line 25.

Namely, the amplifier 101 uses each of the transistors 11 and 21 to amplify the high-frequency signal supplied from the input unit 41, and combines the amplified signals output from the transistors 11 and 21 via the transmission lines 15 and 25 for provision to the output unit 42. In order to reduce oscillation caused by a phase difference between the signals output from the transistors 11 and 21, the amplifier 101 includes a resistor 51 connecting the connection point 14 and the connection point 24. The resistor 51 is an oscillation-suppression resistor (i.e., oscillation-stabilization resistor) connected to the connection points of the adjacent amplification stages 10 and 20.

In the amplifier 101 illustrated in FIG. 3, the length of the transmission line 15 connecting the connection point 14 and the output unit 42 (i.e., the length from the connection point 14 to the output unit 42) is a quarter wavelength of the second harmonic. Similarly, the length of the transmission line 25 connecting the connection point 24 and the output unit 42 (i.e., the length from the connection point 24 to the output unit 42) is a quarter wavelength of the second harmonic.

The antinode of a second harmonic standing wave appears at the connection points 14 and 24 due to the fact that the harmonic processing units 13 and 23 are connected to the connection points 14 and 24, respectively. Because of this, the output unit 42 situated at a distance of a quarter wavelength of the second harmonic from the connection points 14 and 24 corresponds in position to the node of the standing wave. In consideration of this, the amplifier 101 of the present disclosures includes the feedback circuit 60 that feeds back the signal at the output unit 42 to the opposite ends of the resistor 51 connected to the respective connection points 14 and 24 of the amplification stages 10 and 20.

With the presence of such a feedback circuit 60, the phase observed at the output unit 42 where the high-frequency signals amplified by the respective amplification stages 10 and 20 are combined is fed back to the opposite ends of the resistor 51 experiencing the occurrence of a standing wave. Accordingly, the phase of the second harmonic standing wave occurring at the connection point 14 connected to one end of the resistor 51 and the phase of the second harmonic standing wave occurring at the connection point 24 connected to the other end of the resistor 51 are set equal to each other. Electric power applied across the resistor 51 is thus reduced, which reduces the likelihood of an open-circuit failure occurring at the resistor 51. Moreover, reduction in the phase difference between the signal at the connection point 14 and the signal at the connection point 24 further improves the ability of the resistor 51 to reduce the oscillation of a fundamental wave, thereby improving the power added efficiency of the amplifier 101.

The feedback circuit 60 is one or a combination of the following: an inductor and a resistor. In the feedback circuit 60 illustrated in FIG. 3, either an inductor 61 or a resistor 71, or both, are connected between the output unit 42 and one end of the resistor 51 (i.e., the connection point 14), and either an inductor 62 or a resistor 72, or both, are connected between the output unit 42 and the other end of the resistor 51 (i.e., the connection point 24). The feedback circuit 60 is implemented as a bonding wire inclusive of an inductance component, for example.

Figure 4:
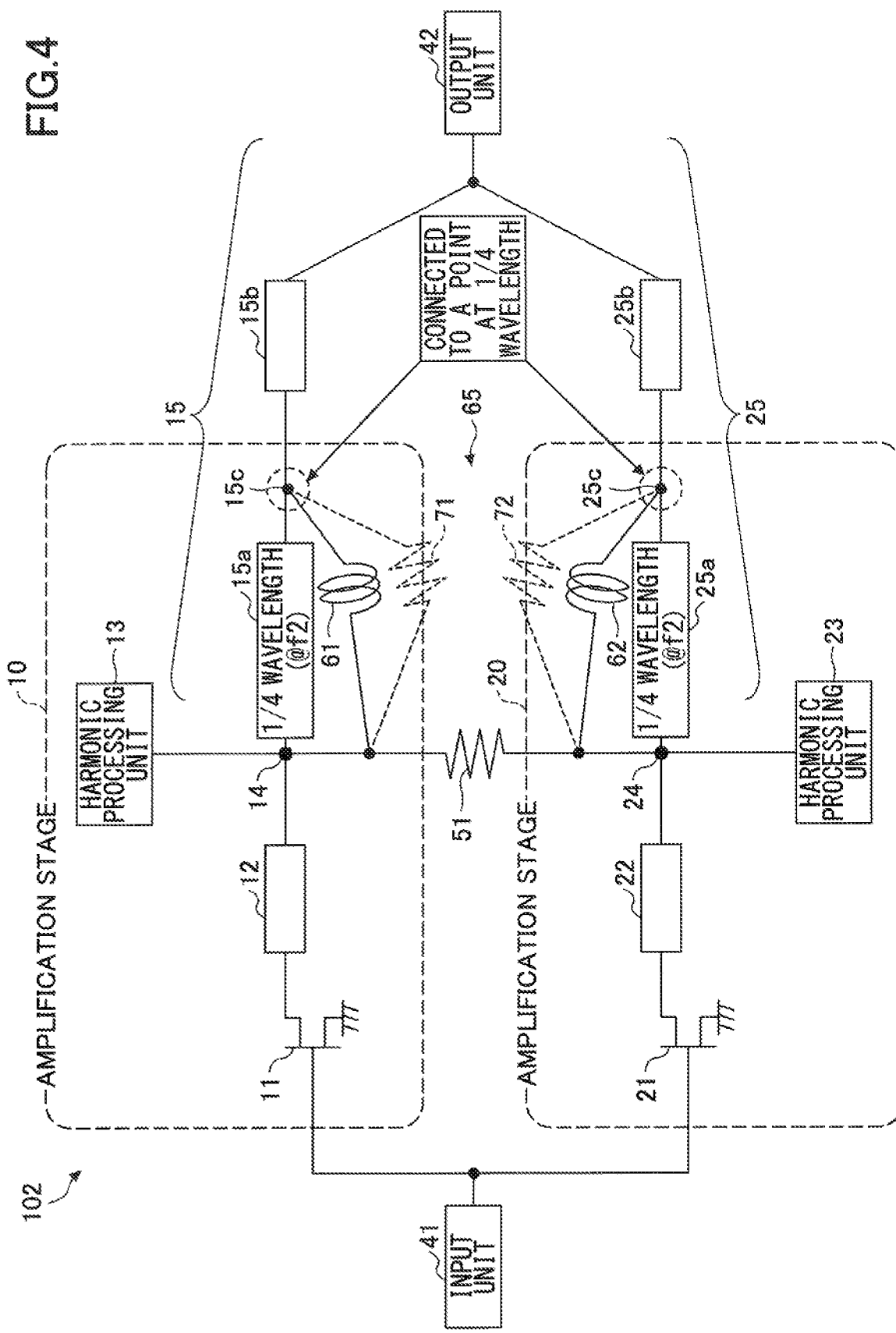
FIG. 4 is a drawing illustrating an amplifier according to a second embodiment.

FIG. 4 is a drawing illustrating an amplifier according to a second embodiment. The configurations and advantages of the second embodiment that are the same as those of the first embodiment will be omitted, but should be understood by referring to the previous descriptions. An amplifier 102 of the second embodiment illustrated in FIG. 4 differs from the amplifier 101 of the first embodiment illustrated in FIG. 3 in that the length of each of the transmission lines 15 and 25 is longer than a quarter wavelength of the second harmonic.

The transmission line 15 illustrated in FIG. 4 includes a transmission line section 15a and a transmission line section 15b. The transmission line section 15a has one end thereof connected to the connection point 14 and the other end thereof connected to one end of the transmission line section 15b. The length of the transmission line section 15a is equal to a quarter wavelength of the second harmonic. The transmission line section 15b has one end thereof connected to the other end of the transmission line section 15a and the other end thereof connected to the output unit 42. Similarly, the transmission line 25 illustrated in FIG. 4 includes a transmission line section 25a and a transmission line section 25b. The transmission line section 25a has one end thereof connected to the connection point 24 and the other end thereof connected to one end of the transmission line section 25b. The length of the transmission line section 25a is equal to a quarter wavelength of the second harmonic. The transmission line section 25b has one end thereof connected to the other end of the transmission line section 25a and the other end thereof connected to the output unit 42.

The antinode of a second harmonic standing wave appears at the connection points 14 and 24 due to the fact that the harmonic processing units 13 and 23 are connected to the connection points 14 and 24, respectively. Because of this, points 15c and 25c situated at a distance of a quarter wavelength of the second harmonic from the respective connection points 14 and 24 correspond in position to the node of a standing wave. In consideration of this, the amplifier 102 of the present disclosures includes a feedback circuit 65 that feeds back the signals at the midway points 15c and 25c on the respective transmission lines 15 and 25 to the opposite ends of the resistor 51 connected to the respective connection points 14 and 24 of the amplification stages 10 and 20.

With the presence of such a feedback circuit 65, the phases observed at the points 15c and 25c at which the nodes of standing waves appear are fed back to the opposite ends of the resistor 51 experiencing the occurrence of a standing wave. Accordingly, the phase of the second harmonic standing wave occurring at the connection point 14 connected to one end of the resistor 51 and the phase of the second harmonic standing wave occurring at the connection point 24 connected to the other end of the resistor 52 are set equal to each other. Electric power applied across the resistor 51 is thus reduced, which reduces the likelihood of an open-circuit failure occurring at the resistor 51. Moreover, reduction in the phase difference between the signal at the connection point 14 and the signal at the connection point 24 further improves the ability of the resistor 51 to reduce the oscillation of a fundamental wave, thereby improving the power added efficiency of the amplifier 102.

Figure 5:
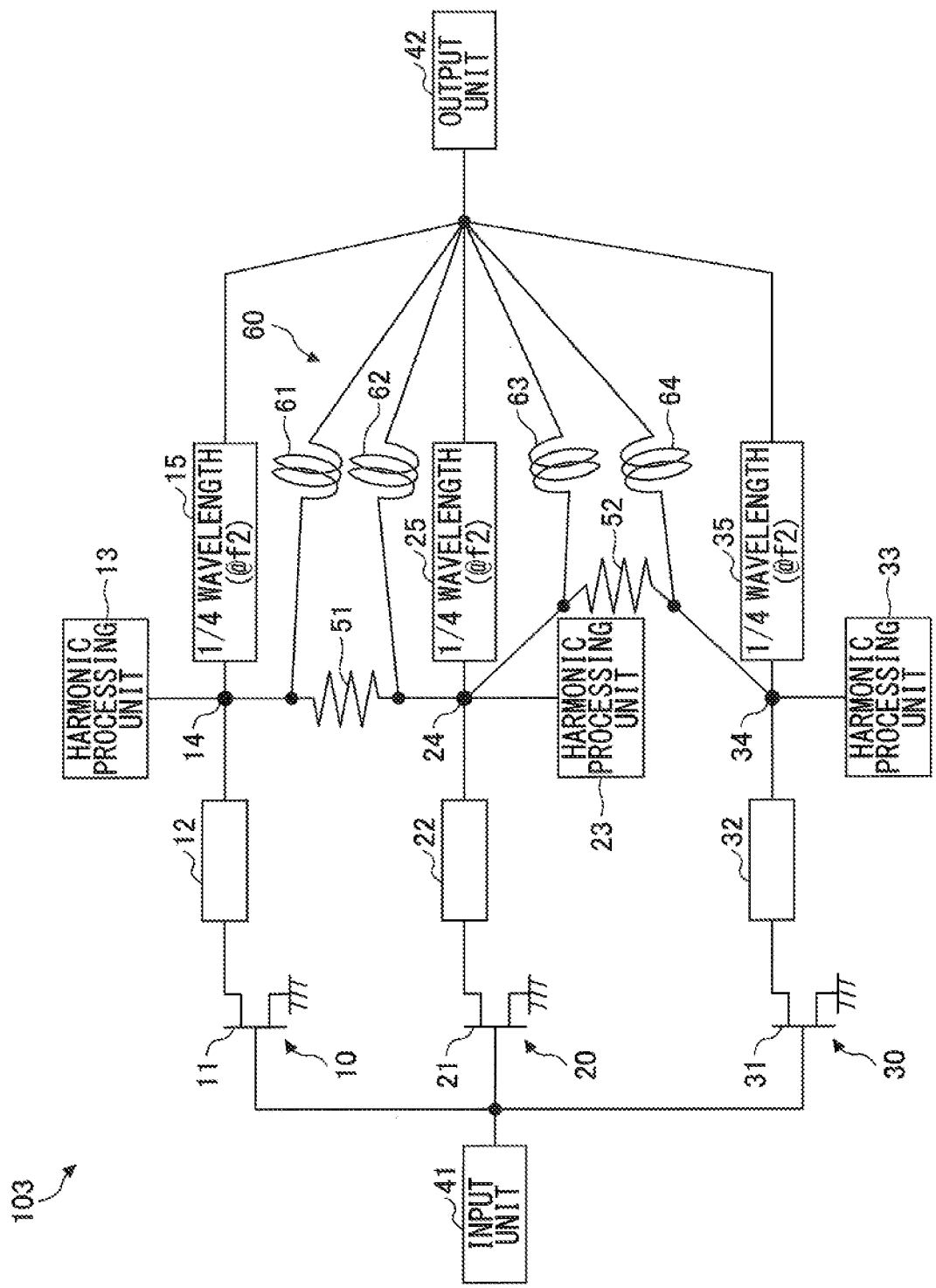
FIG. 5 is a drawing illustrating an amplifier according to a third embodiment.

FIG. 5 is a drawing illustrating an amplifier according to a third embodiment. The configurations and advantages of the third embodiment that are the same as those of the first embodiment will be omitted, but should be understood by referring to the previous descriptions. An amplifier 103 of the third embodiment illustrated in FIG. 5 differs from the amplifier 101 of the first embodiment illustrated in FIG. 3 in that there are three amplification stages situated in parallel between the input unit 41 and the output unit 42.

The amplifier 103 illustrated in FIG. 5 includes three amplification stages 10, 20, and 30. The amplification stages 10, 20, and 30 have the same or similar circuit configuration. The amplification stage 30 includes a transistor 31, a transmission line 32, a harmonic processing unit 33, a connection point 34, and a transmission line 35, for example.

Namely, the amplifier 103 uses each of the transistors 11, 21, and 31 to amplify the high-frequency signal supplied from the input unit 41, and combines the amplified signals output from the transistors 11, 21, and 31 via the transmission lines 15, 25, and 35 for provision to the output unit 42.

In order to reduce oscillations caused by phase differences between the signals output from the transistors 11, 21, and 31, the amplifier 103 includes the resistor 51 providing a connection between the connection point 14 and the connection point 24 and a resistor 52 providing a connection between the connection point 24 and the connection point 34. The number of stabilization resistors is one fewer than the number of amplification stages.

With the presence of a feedback circuit 60 similar to that of the first embodiment, the phase observed at the output unit 42 where the high-frequency signals amplified by the respective amplification stages 10, 20, and 30 are combined is fed back to the opposite ends of the resistors 51 and 52 experiencing the occurrence of standing waves. As a result, the opposite ends of the resistor 51 are set to the same phase, and the opposite ends of the resistor 52 are also set to the same phase. Electric power applied across the resistors 51 and 52 is thus reduced, which reduces the likelihood of an open-circuit failure occurring at the resistors 51 and 52. The same phase at the opposite ends of the resistor 51 and the same phase at the opposite ends of the resistor 52 further increase the ability of the resistors 51 and 52 to reduce fundamental-wave oscillations, thereby improving the power added efficiency of the amplifier 103.

Similarly to the feedback circuit of the first embodiment, the feedback circuit of the third embodiment includes either an inductor or a resistor, or both. The feedback circuit 60 illustrated in FIG. 5 includes inductors 61 and 62 connected to the respective ends of the resistor 51 and to the output unit 42, and includes inductors 63 and 64 connected to the respective ends of the resistor 52 and to the output unit 42.

Figure 6:
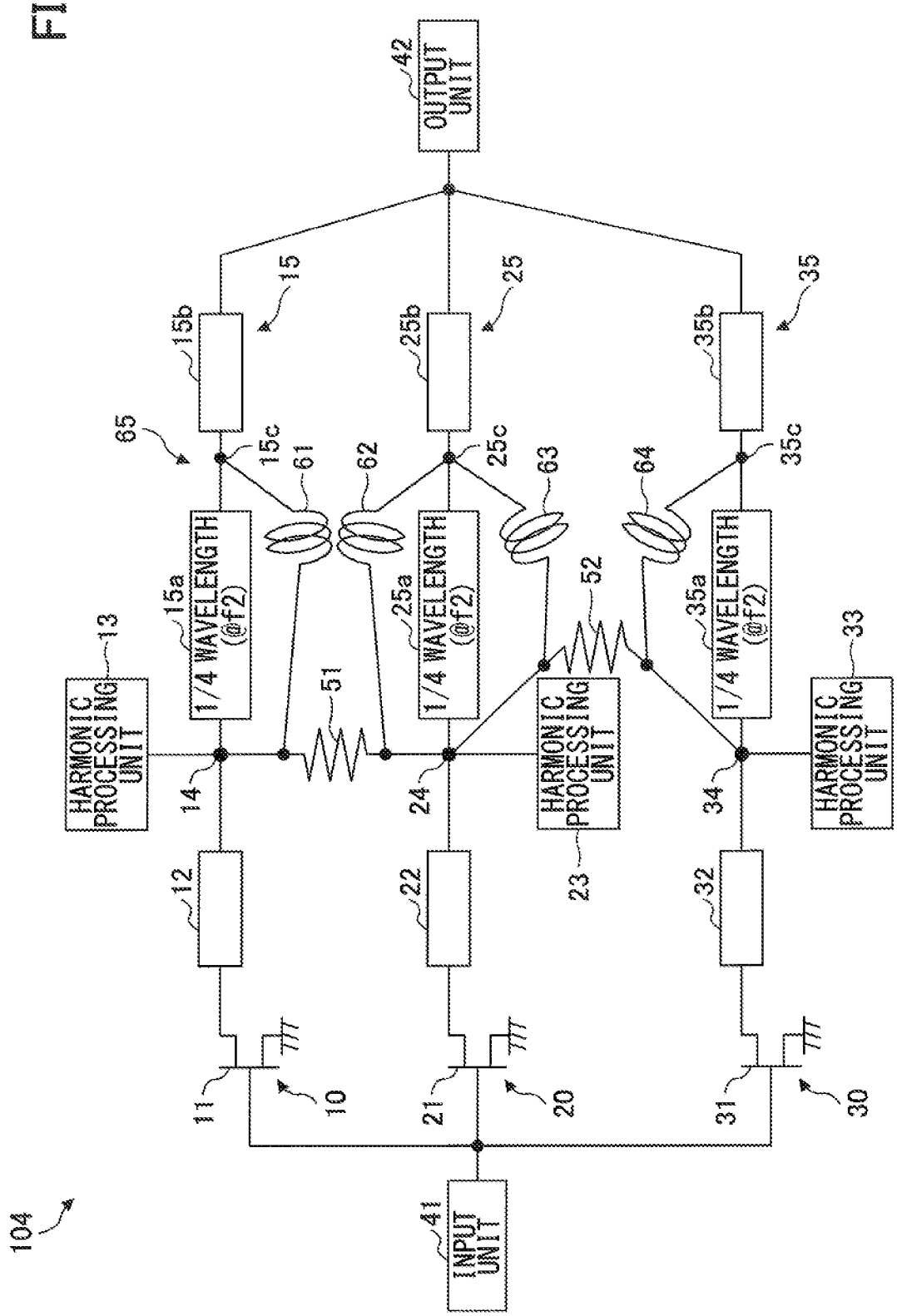
FIG. 6 is a drawing illustrating an amplifier according to a fourth embodiment.

FIG. 6 is a drawing illustrating an amplifier according to a fourth embodiment. The configurations and advantages of the fourth embodiment that are the same as those of the third embodiment will be omitted, but should be understood by referring to the previous descriptions. An amplifier 104 of the fourth embodiment illustrated in FIG. 6 differs from the amplifier 103 of the third embodiment illustrated in FIG. 5 in that the length of each of the transmission lines 15, 25, and 35 is longer than a quarter wavelength of the second harmonic.

The transmission line 35 illustrated in FIG. 6 includes a transmission line section 35a and a transmission line section 35b. The transmission line section 35a has one end thereof connected to the connection point 34 and the other end thereof connected to one end of the transmission line section 35b. The length of the transmission line section 35a is equal to a quarter wavelength of the second harmonic. The transmission line section 35b has one end thereof connected to the other end of the transmission line section 35a and the other end thereof connected to the output unit 42.

With the presence of a feedback circuit 65 similar to that of the second embodiment, the phases observed at the points 15c and 25c at which the nodes of standing waves appear are fed back to the opposite ends of the resistor 51 experiencing the occurrence of a standing wave. Further, the phases observed at the points 25c and 35c at which the nodes of standing waves appear are fed back to the opposite ends of the resistor 52 experiencing the occurrence of a standing wave. As a result, the opposite ends of the resistor 51 are set to the same phase, and the opposite ends of the resistor 52 are also set to the same phase. Electric power applied across the resistors 51 and 52 is thus reduced, which reduces the likelihood of an open-circuit failure occurring at the resistors 51 and 52. The same phase at the opposite ends of the resistor 51 and the same phase at the opposite ends of the resistor 52 further increase the ability of the resistors 51 and 52 to reduce fundamental-wave oscillations, thereby improving the power added efficiency of the amplifier 104.

Figure 7:
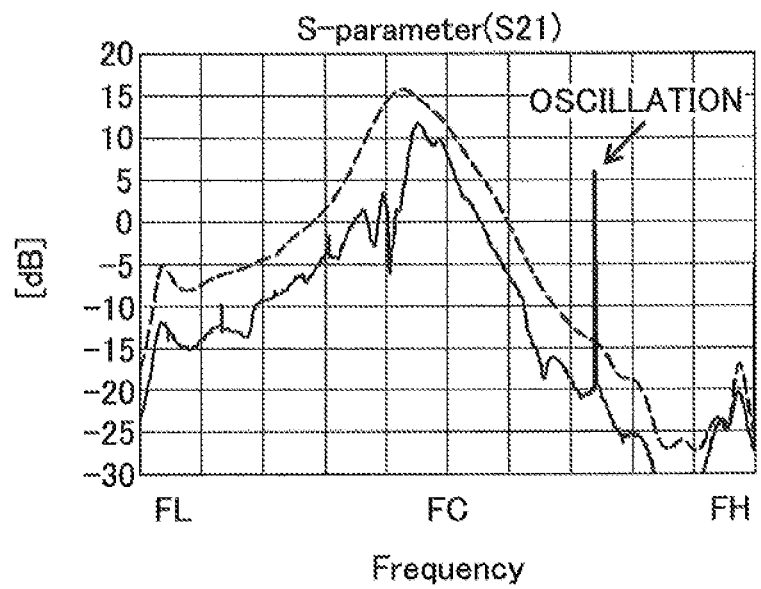
FIG. 7 is a drawing illustrating measured S21 characteristics.

FIG. 7 is a drawing illustrating an example of measured characteristics of S21 which is one of the S parameters. S21 represents the amplification gain of an amplifier. In FIG. 7, a solid line represents the amplification gain of the amplifier 1000 (i.e., comparative example) illustrated in FIG. 2, and a dashed line represents the amplification gain of the amplifier 101 (i.e., first embodiment) illustrated in FIG. 3. In the case of the amplifier 1000 having no feedback circuits, oscillation occurs between an intermediate frequency FC and a high frequency FH. In the case of the amplifier 101 having the feedback circuit 60, oscillation is suppressed, and the amplification gain increases between the intermediate frequency FC and a high frequency FH.

Figure 8:
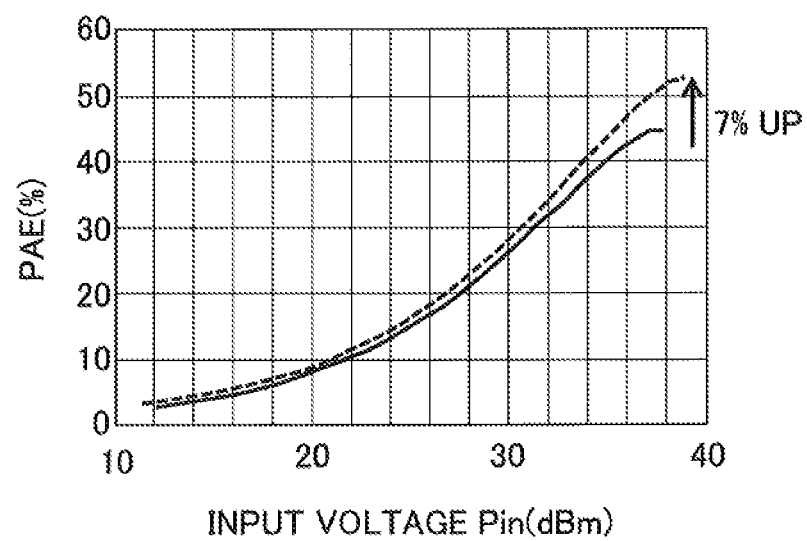
FIG. 8 is a drawing illustrating measured power added efficiency.

FIG. 8 is a drawing illustrating an example of measured added power efficiency (i.e., PAE) with respect to input power Pin applied to an amplifier. In FIG. 8, a solid line represents the PAE of the amplifier 1000 (i.e., comparative example) illustrated in FIG. 2, and a dashed line represents the PAE of the amplifier 101 (i.e., first embodiment) illustrated in FIG. 3. As illustrated in FIG. 8, the PAE of the amplifier 101 exhibits improvements over the PAE of the amplifier 1000, with a 7% increase with respect to relatively high input power Pin.

According to the present disclosures, the open-circuit failure of resistors is reduced Although the amplifiers have been described by referring to the embodiments, the present invention is not limited to these embodiments. Various modifications and improvements such as combining or replacing an embodiment partially or entirely with one or more other embodiments may be made without departing from the scope of the present invention.

For example, a circuit configuration similar to those of the described embodiments is employed to produce the same or similar advantages as described heretofore even in the case in which four or more amplification stages are provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An amplifier comprising:
 a plurality of amplification stages connected in parallel between an input point and an output point; and
 a feedback circuit,
 wherein each of the plurality of amplification stages includes:
 a transistor configured to amplify a high-frequency signal supplied from the input point;
 a harmonic processing unit coupled to an output node of the transistor and configured to process harmonics present in an amplified high-frequency signal output from the output node;
 a connection point between the output node and the harmonic processing unit; and
 a transmission line connecting the connection point and the output point, wherein the feedback circuit is configured to feed back a signal at the output point or a midway point of the transmission line of a given one of the amplification stages to a first end of a resistor, the first end of the resistor being connected to the connection point of the given one of the amplification stages, and a second end of the resistor being connected to the connection point of another one of the amplification stages.

2. The amplifier as claimed in claim 1, wherein the harmonic processing unit is configured to provide a short-circuit state with respect to a second harmonic among the harmonics.

3. The amplifier as claimed in claim 1, wherein the harmonic processing unit is an open stub having a length equal to a quarter wavelength of a second harmonic among the harmonics.

4. The amplifier as claimed in claim 2, wherein the feedback circuit is configured to feed back the signal at the output point to the first end of the resistor, and the length of the transmission line is a quarter wavelength of the second harmonic.

5. The amplifier as claimed in claim 2, wherein the feedback circuit is configured to feed back the signal at the midway point to the first end of the resistor, and the midway point is at a distance of a quarter wavelength of the second harmonic from the connection point.

6. The amplifier as claimed in claim 1, wherein the feedback circuit is at least one of an inductor and a resistor.

7. A transmitter, comprising:
an amplifier; and
an antenna coupled to an output node of the amplifier,
wherein the amplifier includes:
a plurality of amplification stages connected in parallel between an input point and an output point; and
a feedback circuit,
wherein each of the plurality of amplification stages includes:
a transistor configured to amplify a high-frequency signal supplied from the input point;
a harmonic processing unit coupled to an output node of the transistor and configured to process harmonics present in an amplified high-frequency signal output from the output node;
a connection point between the output node and the harmonic processing unit; and
a transmission line connecting the connection point and the output point,
wherein the feedback circuit is configured to feed back a signal at the output point or a midway point of the transmission line of a given one of the amplification stages to a first end of a resistor, the first end of the resistor being connected to the connection point of the given one of the amplification stages, and a second end of the resistor being connected to the connection point of another one of the amplification stages.

* * * * *